United States Patent
Huang et al.

(10) Patent No.: US 10,481,796 B2
(45) Date of Patent: Nov. 19, 2019

(54) METHOD FOR SCREENING BAD DATA COLUMNS IN DATA STORAGE MEDIUM

(71) Applicant: SILICON MOTION, INC., Jhubei, Hsinchu County (TW)

(72) Inventors: Sheng-Yuan Huang, Jhubei (TW); Yu-Ping Chang, Jhubei (TW)

(73) Assignee: SILICON MOTION, INC., Jhubei (TW)

( * ) Notice: Subject to any disclaimer, the term of this patent is extended or adjusted under 35 U.S.C. 154(b) by 0 days.

(21) Appl. No.: 16/028,891

(22) Filed: Jul. 6, 2018

(65) Prior Publication Data

US 2018/0314428 A1 Nov. 1, 2018

Related U.S. Application Data

(63) Continuation of application No. 15/243,972, filed on Aug. 23, 2016, now Pat. No. 10,261,689.

(30) Foreign Application Priority Data

May 11, 2016 (TW) .............................. 105114620 A

(51) Int. Cl.
| | |
|---|---|
| *G06F 3/06* | (2006.01) |
| *G11C 29/44* | (2006.01) |
| *G11C 29/00* | (2006.01) |
| *G11C 29/52* | (2006.01) |

(52) U.S. Cl.
CPC .......... *G06F 3/0604* (2013.01); *G06F 3/0619* (2013.01); *G06F 3/0644* (2013.01); *G06F 3/0679* (2013.01); *G11C 29/44* (2013.01); *G11C 29/52* (2013.01); *G11C 29/804* (2013.01); *G11C 29/76* (2013.01); *G11C 2029/4402* (2013.01)

(58) Field of Classification Search
None
See application file for complete search history.

(56) References Cited

U.S. PATENT DOCUMENTS

| | | | | |
|---|---|---|---|---|
| 7,076,703 | B1 * | 7/2006 | Le ........................ | G11C 29/804 714/711 |
| 2014/0157087 | A1 * | 6/2014 | Yurzola ............... | G06F 11/1068 714/773 |
| 2016/0283367 | A1 * | 9/2016 | Wang .................... | G11C 29/76 |

* cited by examiner

*Primary Examiner* — Denise Tran

(57) ABSTRACT

A method for screening bad data columns in a data storage medium comprising a plurality of data columns includes: labeling or recording a plurality of bad data columns as a bad data column group, wherein the bad data columns are selected from the data columns in the data storage medium, each of the bad data column groups labels or records a position and a number of the bad data columns; determining whether the total number of the bad data columns is greater than a total number of the bad data column groups; and if yes, labeling or recording any two bad data columns of the bad data columns spaced apart by P data columns as one of the bad data column groups, wherein P is a positive integer.

3 Claims, 4 Drawing Sheets

METHOD FOR SCREENING BAD DATA COLUMNS IN DATA STORAGE MEDIUM

This Application is a continuation application of prior application Serial U.S. Ser. No. 15/243,972 filed on Aug. 23, 2016, the entire contents of which are incorporated herein by reference.

FIELD OF THE INVENTION

The present invention relates to a data storing technology, and more particularly to a method for screening bad data columns in a data storage medium.

BACKGROUND OF THE INVENTION

A data storage device, such as solid state drive (SSD), secure digital (SD) memory card or portable flash memory, is mainly constituted of a control unit and a data storage medium. The data storage medium is constituted of a plurality of data columns for storing data.

Inevitably, secondary products may be produced in the manufacturing process of data storage devices. Therefore, it is necessary to screen out all bad data columns in the data storage medium and label or record (by using software, for example) the bad data columns in a bad data column table before releasing the secondary products to the market. According to the bad data column table, the control unit is prevented from accessing the labeled bad data columns so as to avoid data access error during operation.

Conventionally, bad data columns are labeled or recorded one by one. However, the number of available labels or records for bad data columns is limited (for example, 254 labels at most). Therefore, if the data storage medium is largely defective, the available labels for bad data columns may be used up and the resulting unlabeled or unrecorded bad data columns may reduce the correcting capability (e.g., 44-bit correction) of the ECC (Error Correcting Code), thus leading to improper corrections of data that could have been properly corrected.

SUMMARY OF THE INVENTION

One objective of the present invention is to provide a method for screening bad data columns in a data storage medium. In the method, adjacent bad data columns are labeled or recorded as bad data column groups so that more bad data columns can be labeled when available labels are limited.

The present invention provides a method for screening bad data columns in a data storage medium comprising a plurality of data columns. The method includes steps of: labeling or recording a plurality of bad data columns as a bad data column group, wherein the bad data columns are selected from the data columns in the data storage medium, each of the bad data column groups labels or records a position and a number of the bad data columns; determining whether the total number of the bad data columns is greater than a total number of the bad data column groups; and if yes, labeling or recording any two bad data columns of the bad data columns spaced apart by P data columns as one of the bad data column groups, wherein P is a positive integer.

The present invention further provides a method for recording a plurality of bad data columns of a data storage medium. The method includes steps of: determining whether one of the bad data columns is not recorded; if the determination is true, recording each of two sequential of the bad data columns spaced apart by P data columns in a bad data column group, wherein P is a positive integer.

In summary, by labeling or recording adjacent bad data columns as a bad data column group, the present invention can label more bad data columns using limited number of available labels.

BRIEF DESCRIPTION OF THE DRAWINGS

Other advantages, objectives and features of the present invention will become apparent from the following description referring to the attached drawings.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
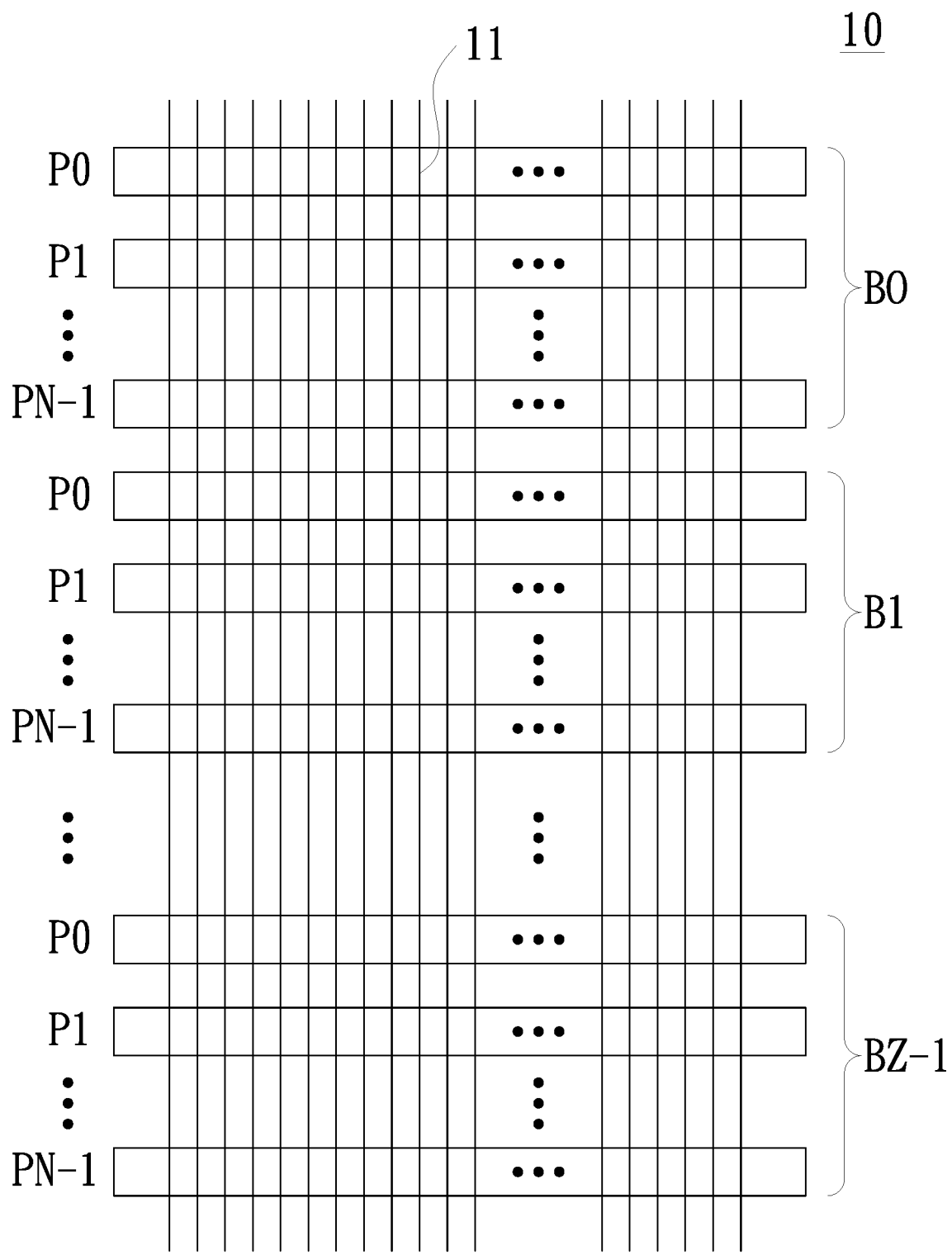
FIG. 1 is a schematic illustration of a data storage medium in accordance with an embodiment of the present invention.

FIG. 1 is a schematic illustration of a data storage medium in accordance with an embodiment of the present invention. As shown in FIG. 1, the data storage medium 10 of the present embodiment includes a plurality of data columns 11. The data columns 11 located in the same row are defined as a data page (such as data pages P0, P1, . . . , PN−1). Every N data pages is grouped as a data block (such as data blocks B0, B1, . . . , BZ−1). In the present embodiment, both of the aforementioned N and Z are positive integers. In the present embodiment, the data storage medium 10 may be a non-volatile memory, such as a flash memory, MRAM (Magnetic RAM), FRAM (Ferroelectric RAM), PCM (Phase Change Memory), STTRAIVI (Spin-Transfer Torque RAM), ReRAM (Resistive RAM), Memristor or other memory device suitable for long-term data storage.

Figure 2:
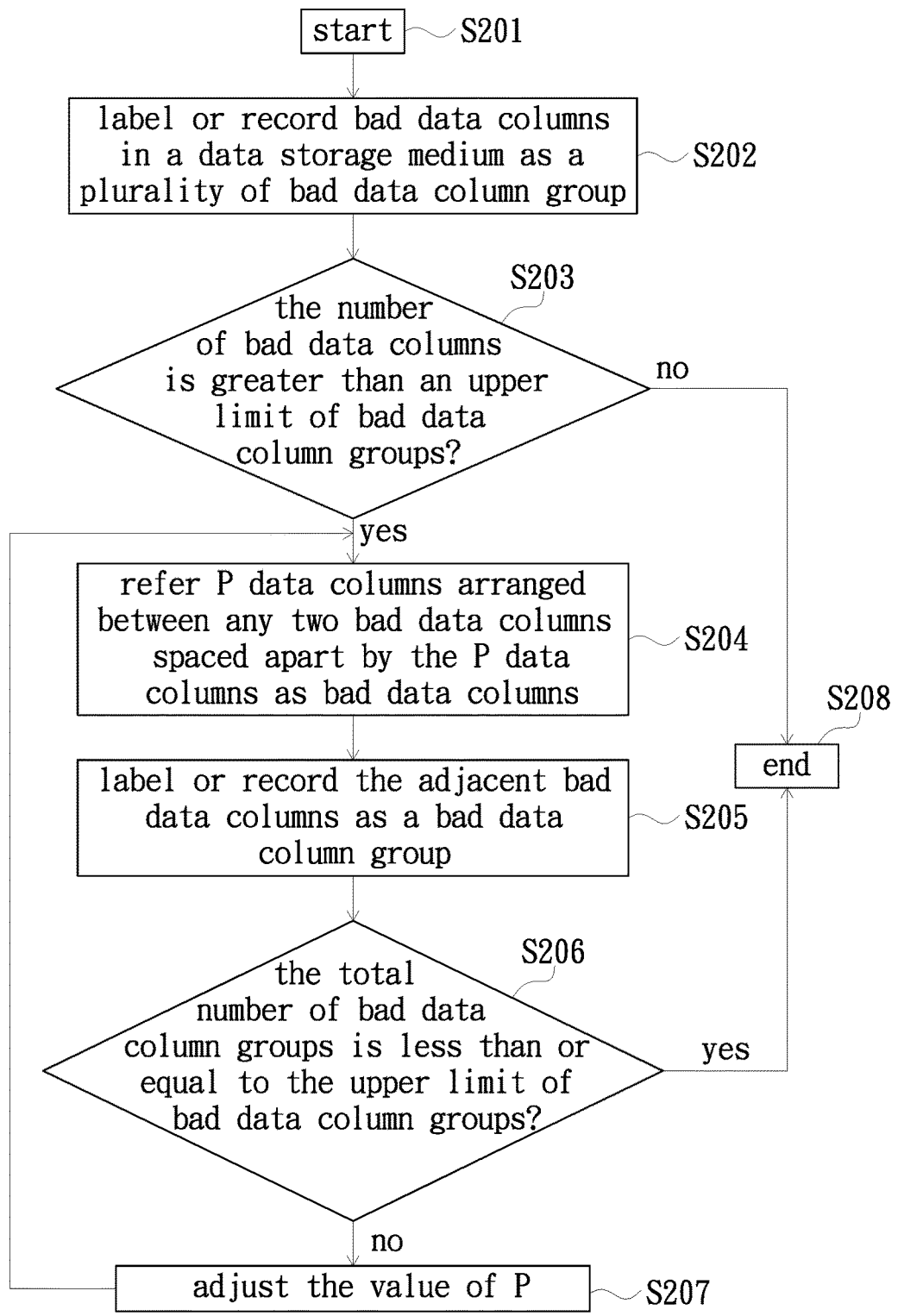
FIG. 2 is a flowchart of a method for screening bad data columns in a data storage medium in accordance with the first embodiment of the present invention.

FIG. 2 is a flowchart of a method for screening bad data columns in a data storage medium in accordance with the first embodiment of the present invention. First, step S201: starting the method for screening bad data columns of the present embodiment. Thereafter, step S202: labeling or recording the bad data columns in the data storage medium (e.g., the data storage medium 10) as a plurality of bad data column groups; wherein each of the bad data column groups labels or records one bad data column initially. Because the process of determining whether a data column is a bad data column is of a conventional technology, no redundant detail is to be given herein. Specifically, different from the convention method for recording bad data columns, the bad data column group of the present embodiment records not only the starting position but also the total number of adjacent bad data columns. Taking the content of a bad data column group is [333, 3] as an example, the [333] indicates that the 333th data column in the data storage medium is the first bad data column in that bad data column group, and the [3] indicates that there are three adjacent bad data columns in that bad data column group. Then, the result of the aforementioned determination for bad data columns is labeled or recorded in the bad data column group. Thereafter, perform step S203: determining whether the total number of bad data columns is greater than an upper limit of bad data column groups. In one embodiment, the upper limit of bad data column groups is set as 254, for example. Thereafter, perform step S208: if the determination is no in step S203, ending the method for screening bad data columns of the present embodiment directly.

Figure 3:
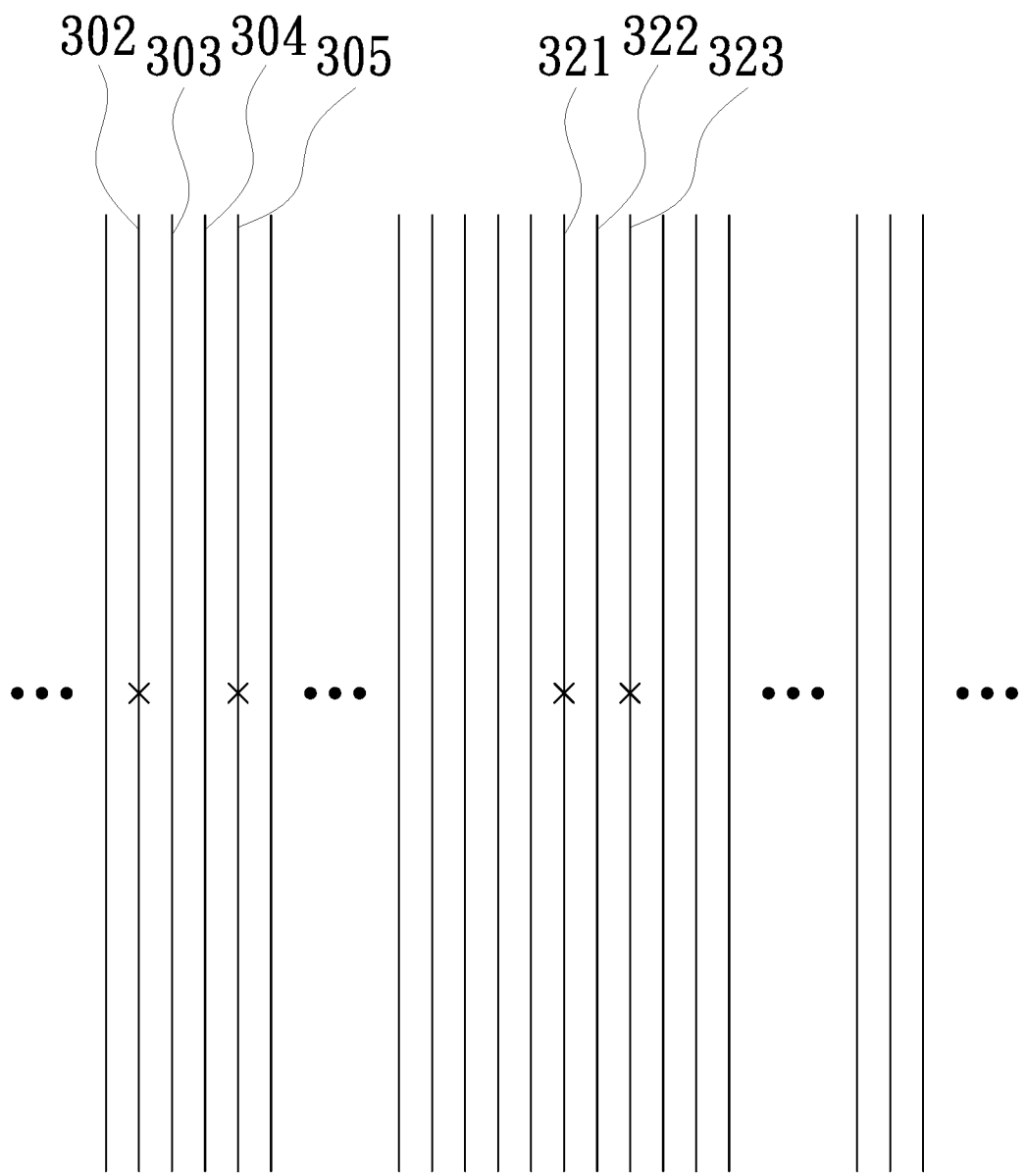
FIG. 3 is a schematic illustration of an exemplary distribution of a portion of bad data columns.

FIG. 3 is a schematic illustration of an exemplary distribution of a portion of bad data columns. In FIG. 3, the data columns labeled with an "X", such as the data columns 302, 305, 321 and 323, are referred to as bad data columns; and the remaining data columns not labeled with the "X" are referred to as normal data columns (that is, data columns having normal functions). Please refer to FIGS. 2 and 3 together. Alternatively, perform step S204: if the determination is yes in step S203, referring P data columns located between any two of the bad data columns spaced apart by the P data columns as bad data columns; wherein P is a positive integer. In the present embodiment, P is set as 1 initially, but the present invention is not limited thereto. For example, as illustrated in FIG. 3, there is only one normal data column 322 between the two bad data columns 321 and 323; therefore, the data column 322 is also referred to as a bad data column in accordance with the rule described in step S204. It is to be understood that the definition of bad data column as exemplarily illustrated by the data columns 321, 322 and 323 also applies to other data columns satisfying the same condition in the data storage medium 10, and no redundant detail is to be given herein.

Thereafter, step S205: labeling or recording the adjacent bad data columns as a bad data column group. For example, as illustrated in FIG. 3, the data columns 321, 322 and 323 are referred as three adjacent bad data columns as the data column 322 is referred to as a bad data column as previously described. On the contrary, the data columns 302, 303, 304 and 305 are not referred to as adjacent bad data columns as the data columns 303 and 304 are still referred to as normal data columns. Therefore, the data columns 321, 322 and 323 are labeled or recorded as a bad data column group. It is to be understood that the labeling or recording of the adjacent bad data column as a bad data column group as exemplarily illustrated by the data columns 321, 322 and 323 also applies to other data columns satisfying the same condition in the data storage medium 10, and no redundant detail is to be given herein.

Thereafter, step S206: determining whether the total number of bad data column groups is smaller than or equal to the upper limit of bad data column groups. Thereafter, perform step S208: if the determination is yes in step S206, ending the method for screening bad data columns of the present embodiment. Alternatively, perform step S207: if the determination is no in step S206, adjusting the value of P; for example, adding P by one to adjust P to 2.

After step S207 is completed, the method for screening bad data columns of the present embodiment returns back to step S204. Because P has been adjusted from 1 to 2 in step S207, the execution of step S204 is changed to: referring P (e.g., two) data columns located between any two bad data columns spaced apart by the P (e.g., two) data columns as bad data columns; wherein P is a positive integer. For example, as illustrated in FIG. 3, the data columns 321, 322 and 323 have already been labeled or recorded as a bad data column group as previously described; and currently the two data column 303 and 304 are referred to as bad data columns due to that the two data columns 303 and 304 are located between the two bad data columns 302 and 305 spaced apart by the two data columns 303 and 304. It is to be understood that the definition of bad data columns as exemplarily illustrated by the data columns 302, 303, 304 and 305 also applies to other data columns satisfying the same condition in the data storage medium 10, and no redundant detail is to be given herein.

Thereafter, performing step S205: labeling or recording the adjacent bad data columns as a bad data column group. For example, as illustrated in FIG. 3, the adjacent data columns 321, 322 and 323 have been referred to as a bad data column group as previously described; and currently the adjacent data columns 302, 303, 304 and 305 are referred to as a bad data column group as the two data columns 303 and 304 are referred to as bad data columns. It is to be understood that the labeling or recording of the adjacent bad data columns as a bad data column group as exemplarily illustrated by the data columns 302, 303, 304 and 305 also applies to other data columns satisfying the same condition in the data storage medium 10, and no redundant detail is to be given herein.

Thereafter, performing step S206: determining whether the total number of bad data column groups is smaller than or equal to the upper limit of bad data column groups. Therefore, by repeating steps S204-S207, the method for screening bad data columns of the present embodiment is ended (step S208) once it is determined that the total number of bad data column groups is smaller than or equal to the upper limit of bad data column groups (step S206). As a result, the objective of managing the bad data columns more effectively of the present invention is achieved by labeling or recording adjacent bad data columns as a bad data column group.

Figure 4:
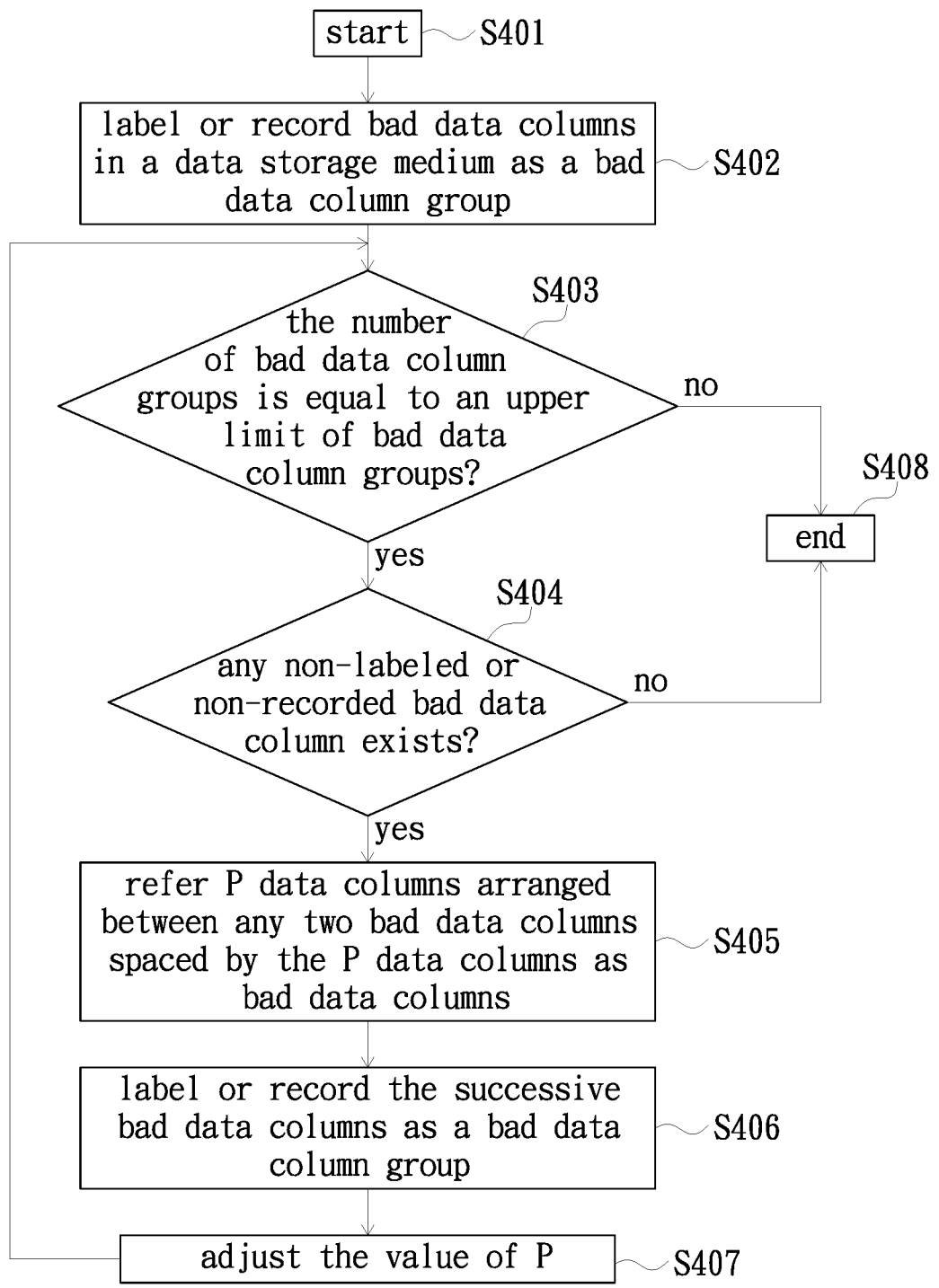
FIG. 4 is a flowchart of a method for screening bad data columns in a data storage medium in accordance with the second embodiment of the present invention.

FIG. 4 is a flowchart of a method for screening bad data columns in a data storage medium in accordance with the second embodiment of the present invention. First, performing step S401: starting the method for screening bad data columns of the present embodiment starts. Thereafter, performing step S402: labeling or recording the bad data columns in the data storage medium (e.g., the data storage medium 10) as a bad data column group; wherein each of the bad data column groups labels or records one bad data column or a plurality of adjacent bad data columns initially. Thereafter, performing step S403: determining whether the total number of bad data column groups is equal to an upper limit of bad data column groups. If the determination is Yes in step S403, step S404 is performing. Alternatively, if the determination is No in step S403, step S408 is performing. Thereafter, performing step S404: determining whether any non-labeled or non-recorded bad data column exists. Thereafter, performing step S405: if the determination is Yes in step S404, referring P data columns located between any two of the non-labeled or non-recorded bad data columns spaced apart by the P data columns as bad data columns; wherein P is a positive integer. Alternatively, performing step S408: if the determination is No in step S404, ending the method for screening bad data columns of the present embodiment directly. Thereafter, performing step S406: labeling or recording the adjacent bad data columns as a bad data column group. Thereafter, performing step S407: adjusting the value of P. After step S407 is completed, the method for screening bad data columns of the present embodiment returns back to step S403. The second embodiment is similar to the first embodiment. A difference lies in that the determining condition in step S403 of the second embodiment is different from that in step S203 of the first embodiment, and that the second embodiment adopts step S404 for an additional determination. The first embodiment and the second embodiment have the similar operation and determining condition, no redundant detail is to be given herein.

In other embodiments, the method for screening bad data columns of the present invention may adopt both of individual labeling or recording of single bad data column as in the prior art and group labeling or recording of a plurality of bad data columns, and both sets of bad data columns can be recorded in a bad data column table. For example, the upper limit of bad data columns (eg. 128) may be used solely for recording individual bad data columns, while the upper limit of bad data column groups (eg. 128) may be used solely for recording grouped bad data columns. Therefore, the method for screening bad data columns of the present invention is also advantageous in its capability to perform in combination with the method in the prior art.

In summary, by labeling or recording adjacent bad data columns as a bad data column group, the present invention can label more bad data columns using limited number of available labels.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for screening bad data columns in a data storage medium comprising a plurality of data columns, the method comprising steps of:
    labeling or recording a plurality of bad data columns as a bad data column group, wherein the bad data columns are selected from the data columns in the data storage medium, each of the bad data column groups labels or records a position and a number of the bad data columns;
    determining whether the total number of the bad data columns is greater than an upper limit of the bad data column groups; and
    labeling or recording any two bad data columns of the bad data columns spaced apart by P data columns as one of the bad data column groups, based on the determining being yes, wherein P is a positive integer.

2. The method for screening bad data columns according to claim 1, wherein the bad data column groups are recorded in a bad column table.

3. The method for screening bad data columns according to claim 1, further comprising a step of:
    adjusting the value of P by one.

* * * * *